US012772891B2

(12) United States Patent
Carew et al.

(10) Patent No.: US 12,772,891 B2
(45) Date of Patent: Oct. 20, 2026

(54) INERT GAS CHAMBER COMPRISING THERMOCOMPRESSION BONDING SYSTEM AND MANUFACTURING METHOD THEREOF

(71) Applicant: MRSI Systems LLC, Tewksbury, MA (US)

(72) Inventors: Dennis Carew, Burlington, MA (US); Julius Ortega, Lowell, MA (US)

(73) Assignee: MRSI Systems LLC, Tewksbury, MA (US)

( * ) Notice: Subject to any disclaimer, the term of this patent is extended or adjusted under 35 U.S.C. 154(b) by 489 days.

(21) Appl. No.: 18/266,487

(22) PCT Filed: Dec. 13, 2021

(86) PCT No.: PCT/US2021/063097
§ 371 (c)(1),
(2) Date: Jun. 9, 2023

(87) PCT Pub. No.: WO2022/126018
PCT Pub. Date: Jun. 16, 2022

(65) Prior Publication Data

US 2024/0047412 A1 Feb. 8, 2024

Related U.S. Application Data

(60) Provisional application No. 63/124,277, filed on Dec. 11, 2020.

(51) Int. Cl.
*H10W 72/00* (2026.01)

(52) U.S. Cl.
CPC ...... *H10W 72/0711* (2026.01); *H10W 72/072* (2026.01); *H10W 72/07125* (2026.01);
(Continued)

(58) Field of Classification Search
CPC ............. H01L 21/677; H01L 21/67739; H01L 21/67742; H01L 24/75; H01L 2224/75101;
(Continued)

(56) References Cited

U.S. PATENT DOCUMENTS 5,553,768 A * 9/1996 Lasto .................... B23K 1/012 228/9
2007/0107214 A1 5/2007 Tanabe
(Continued)

FOREIGN PATENT DOCUMENTS

| | | |
|---|---|---|
| CN | 203423147 U | 2/2014 |
| KR | 101476987 B1 | 12/2014 |

OTHER PUBLICATIONS

International Search Report for PCT Appl. No. PCT/US2021/063097 mail date Apr. 13, 2022, 10 pages.
(Continued)

*Primary Examiner* — Wael M Fahmy
*Assistant Examiner* — Shamita S Hanumasagar
(74) *Attorney, Agent, or Firm* — Maine Cernota & Curran

(57) ABSTRACT

A die bonding system uses an inert gas chamber having a bottom aperture through which a heater assembly can insert a part for bonding, a cover having a top aperture through which a die bond head can insert and bond a die to the part, and a plurality of apertures through a base of the inert gas chamber through which a forming gas is bled through to evacuate the chamber of oxygen before performing a die bonding operation, reducing the potential for oxidation while maintaining cycle times suitable for use in a production environment.

17 Claims, 6 Drawing Sheets

(52) U.S. Cl.
CPC ................. *H10W 72/07183* (2026.01); *H10W 72/07232* (2026.01); *H10W 72/07236* (2026.01)

(58) Field of Classification Search
CPC . H01L 2224/75251; H01L 2224/75301–7531; H01L 2224/7565–75652; H01L 2224/75821–75823; H01L 2224/75841–75843; H01L 2224/759; H01L 2224/75901; H01L 2224/7598; H01L 2224/81203; H01L 2224/81815; H10W 72/0711; H10W 72/07125; H10W 72/07141; H10W 72/07183; H10W 72/072; H10W 72/07232
See application file for complete search history.

(56) References Cited

U.S. PATENT DOCUMENTS

| | | | | |
|---|---|---|---|---|
| 2016/0329296 | A1 | 11/2016 | Wasserman | |
| 2016/0351527 | A1* | 12/2016 | Lau | H01L 21/67742 |
| 2019/0189586 | A1* | 6/2019 | Fujita | B23K 35/262 |
| 2021/0257233 | A1* | 8/2021 | Narasimhan | H01L 21/6719 |

OTHER PUBLICATIONS

International Preliminary Report on Patentability for Application No. PCT/US2021/063097 mail date Jun. 22, 2023, 7 pages.

* cited by examiner

INERT GAS CHAMBER COMPRISING THERMOCOMPRESSION BONDING SYSTEM AND MANUFACTURING METHOD THEREOF

RELATED APPLICATIONS

This application is a national phase application filed under 35 USC § 371 of PCT Application No. PCT/US2021/063097 with an International filing date of Dec. 13, 2021, which claims the benefit of U.S. Provisional Patent 63/124,277 filed Dec. 11, 2020. Each of these applications is herein incorporated by reference in its entirety for all purposes.

FIELD OF THE DISCLOSURE

The present disclosure relates to micro-electronic packaging, and, more particularly, to systems and methods of creating an inert atmosphere for bonding dies to substrates.

BACKGROUND

The manufacture of integrated circuits (ICs) generally involves the use of complex lithographic processes to form microscopic solid-state devices and circuits in semiconductor wafers. These lithographic processes typically include forming layers of material on the wafer, patterning the layers, doping the substrate and/or the patterned layers and heat-treating (e.g., annealing) the resulting structures. These processes are then repeated to build up the IC structure. The result is a wafer containing a large number of ICs.

After the wafer is formed, it then will typically go through a sorting process. Sorting involves electrically testing each IC chip on the wafer for functionality. After sorting, the wafer is separated into individual IC chips, which are then packaged individually or in groups for incorporation onto a substrate, such as a printed circuit board (PCB). At this stage of the process, the individual ICs are typically referred to as dies. These dies must then be placed on and fixed to specific locations on a substrate such that they become electronically and/or optically connected to other components with which they are designed to interact.

In the broadest sense, the die attach process can be either epoxy based or eutectic. In a eutectic die attach process, the dies are typically re-flowed in-situ. Solder can either be pre-deposited on the back of the die or substrate. A die with solder bumps is an example of pre-deposited solder on die. In some cases, the entire die bottom surface can be pre-deposited with solder. In other cases, a solder pre-form is used. The pre-form (typically <25 um thick) is placed first and the die is placed on top of the pre-form. Then, with the bond head holding the die in place, heat is applied to reflow the die.

A common problem in eutectic attach is oxidation of metal surfaces during reflow. For parts that need very high reliability, a sealed chamber that can be pumped down to remove all trace amounts of oxygen, then flooded with forming gas (95/5 or 90/10 $N_2/H_2$ mix) before heating the parts to reflow temperatures, is often used. This method, however, is slow, difficult to automate, and parts are susceptible to movement, since they are not held together during reflow. In some cases, weights are placed on top of the die to hold the die down during reflow, however, this is an added step that further slows down the process and introduces potential errors.

Another approach used in automated environments is the use of a standalone bond chamber specially designed to work with automatic die bonders. The parts (to be bonded) are placed into the chamber by the die bonder. A bond head holds the die in place by exerting a predetermined force on top of the preform before re-flow. The standalone bond chamber, although open on top to allow the bond head to reach down into the chamber, has provisions for introducing forming gas and thereby maintain lower levels of oxygen. The standalone bond chamber is often fitted with a cover which is actuated to a closed position when the bond head is performing other operations, maintaining the low level of oxygen while reducing forming gas consumption. While this method cannot reach the oxygen levels of a sealed chamber, it is faster and easier to automate. Since the parts are placed into the bond chamber for bonding and then subsequently removed by the die bonder after bonding is completed, the cycle time remains too slow in most cases to allow its use in production environments. Furthermore, the level of oxygen present in such chambers is still higher than is optimal, at about 5,000 ppm $O_2$, for many types of bonding operations.

For higher throughputs, substrates onto which dies are to be bonded are typically placed on standard common carriers/pallets (also referred to as 'boats' in micro-electronics packaging). These common carriers are fed, usually by conveyors, through various machines/process steps, such as plasma clean, die bond, wire bonding, and seam sealing. Typically, the substrates are lifted through the common carrier and secured via vacuum prior to performing die (or wire) bonding. After the bonding is completed, the substrate is lowered back to the pallet and the pallet is indexed to bring the next substrate into the bonding area. The challenge is to achieve low oxygen levels when bonding on substrates fed on common carriers.

What is needed, therefore, are systems and methods of achieving low oxygen levels in a die bonding portion of a die bonding system, particularly one that utilizes standard common carriers/pallets, while retaining the ability to operate at the relatively high throughput needed for use in production environments.

SUMMARY

By using a thermocompression bonding system configured to utilize standard common carriers/pallets (i.e. boats) or other suitable bulk conveyance system and having an inert gas chamber having a cover and configured to accept a heater assembly configured to push assemblies to be bonded out of a boat and through a bottom portion of the inert gas chamber, the inert gas chamber being further configured to bleed forming gas through a number of apertures disposed in a bottom surface thereof, the oxygen concentration of the inert gas chamber can be kept to 100 ppm or lower while having a relatively low impact on cycle time.

One embodiment of the present disclosure provides a system for the placement of dies on a substrate, the system comprising: an inert gas chamber comprising a top cover configured to cover at least a portion of the top of the inert gas chamber during a die attach operation, at least one gas input located outside of the inert gas chamber, and a plurality of apertures disposed within the inert gas chamber in a base thereof, the plurality of apertures being in communication with the at least one gas input, wherein the inert gas chamber is configured to accept a heater assembly through a bottommost portion thereof, and wherein the inert gas chamber is configured to accept a die bonding head through a cover portion thereof.

Another embodiment provides such a system for the placement of dies on a substrate wherein the heater assembly is configured to seal the bottommost portion of the inert gas chamber when the heater assembly is located in a bottommost portion thereof.

Yet another embodiment provides such a system for the placement of dies on a substrate wherein the inert gas chamber is mounted to a conveyor system of the system for the placement of dies on a substrate using a T-nut configuration.

Still yet another embodiment provides such a system further comprising an oxygen sensor in operative communication with the inert gas chamber, the oxygen sensor configured to output an oxygen concentration within the inert gas chamber to a process and control system configured to prevent a die attach operation prior to the oxygen concentration within the inert gas chamber dropping below a predetermined level.

Even yet another embodiment provides such a system wherein the top cover is movable between an open position and a closed position.

Even still yet another embodiment provides such a system wherein the top cover is configured for remote actuation between the open and closed positions.

Even yet still another embodiment provides such a system further comprising a bottom cover configured to cover at least a portion of the bottom of the inert gas chamber.

Even another embodiment provides such a system further comprising a gas heater configured to heat a gas passing through the at least one gas input located outside of the inert gas chamber.

Even still yet another embodiment provides such a system wherein the inert gas chamber is mounted to the system via a levelling block comprising levelling screws and set screws, wherein the levelling screws are configured to thread in to the levelling block and press against a surface the levelling block is secured to via the set screws, thereby allowing the inert gas chamber to be levelled.

Still even another embodiment provides such a system further comprising a gas heater configured to heat a gas passing through the at least one gas input outside of the inert gas chamber.

One embodiment of the present disclosure provides a method of die bonding using an inert gas chamber, the method comprising: providing an inert gas chamber, the inert gas chamber comprising: a top cover configured to cover at least a portion of the top of the inert gas chamber, at least one gas input located outside of the inert gas chamber, and a plurality of apertures disposed within the inert gas chamber in a base thereof, the plurality of apertures being in communication with the at least one gas input, wherein the inert gas chamber is configured to accept a heater assembly through a bottommost portion thereof, and wherein the inert gas chamber is configured to accept a die bonding head through a cover portion thereof, introducing at least one part to be bonded to the inert gas chamber; closing the top cover of the inert gas chamber; inserting the heater assembly through a bottommost portion of the inert gas chamber; flooding the inert gas chamber with a substantially inert gas through the at least one gas input; bonding the at least one part to be bonded; opening the top cover of the inert gas chamber; and removing the plurality of parts from the inert gas chamber.

One embodiment of the present disclosure provides an inert gas chamber, the inert gas chamber comprising: a top cover configured to cover at least a portion of a top of the inert gas chamber; at least one gas input located outside of the inert gas chamber; and a plurality of apertures disposed within the inert gas chamber in a base thereof, the plurality of apertures being in communication with the at least one gas input, wherein the inert gas chamber is configured to accept a heater assembly through a bottommost portion thereof, and wherein the inert gas chamber is configured to accept a die bonding head through a cover portion thereof.

Another embodiment provides such an inert gas chamber wherein inert gas chamber is configured to utilize a conveyance system configured to accommodate a plurality of parts to be bonded.

Even another embodiment provides such an inert gas chamber further comprising an oxygen sensor in operative communication with the inert gas chamber, the oxygen sensor configured to output the oxygen concentration within the inert gas chamber to a process and control system.

Even still another embodiment provides such an inert gas chamber wherein the top cover is movable between an open position and a closed position.

Even still yet another embodiment provides such an inert gas chamber wherein the top cover is configured for remote actuation between the open and closed positions.

A still yet even another embodiment provides such an inert gas chamber further comprising a bottom cover configured to cover at least a portion of the bottom of the inert gas chamber.

Still yet even a different embodiment provides such an inert gas chamber wherein the bottom cover is movable between an open position and a closed position and wherein the bottom cover is configured for remote actuation between the open and closed positions.

An even still further embodiment provides such an inert gas chamber wherein the inert gas chamber is configured for mounting to a thermocompression bonding system via a levelling block comprising levelling screws and set screws, wherein the levelling screws are configured to thread in to the levelling block and press against a surface the levelling block is secured to via the set screws, thereby allowing the inert gas chamber to be levelled.

An even still yet further embodiment provides such an inert gas chamber further comprising a gas heater configured to heat a gas passing through the at least one gas input outside of the inert gas chamber.

The features and advantages described herein are not all-inclusive and, in particular, many additional features and advantages will be apparent to one of ordinary skill in the art in view of the drawings, specification, and claims. Moreover, it should be noted that the language used in the specification has been selected principally for readability and instructional purposes and not to limit the scope of the inventive subject matter.

These and other features of the present embodiments will be understood better by reading the following detailed description, taken together with the figures herein described. The accompanying drawings are not intended to be drawn to scale. For purposes of clarity, not every component may be labeled in every drawing.

DETAILED DESCRIPTION

Thermocompression bonding is one method used to bond a die, also known as a chip, to a substrate. It is sometimes also referred to as diffusion bonding, pressure joining, and thermocompression or solid state welding or bonding. This process takes advantage of surface diffusion, grain boundary diffusion and bulk diffusion to physically and electrically connect a die to a substrate.

Due to the high temperatures used to attach a die to a substrate, which are required to reflow the solder used in the attach operation, oxidation is unavoidable unless the oxygen content of the atmosphere is kept to a minimal level. Embodiments of the present disclosure solve this problem by providing a thermocompression bonding system 102 comprising an inert gas chamber 100 configured to utilize standard common carriers/pallets, which may also be referred to as boats, without the need for a standalone, remote bond chamber. In embodiments, the inert gas chamber 100 is evacuated using an inert gas to create a substantially oxygen-free environment in which the die bonding operation can be conducted, thereby avoiding oxidation. By removing the need to transport the dies and substrates to a remote bond chamber and by reducing the time between chamber uses, a suitably low level of oxygen is maintained while increasing cycle times over the prior art. In embodiments, oxygen levels in the inert gas chamber 100 are kept to below 100 ppm.

Figure 1:
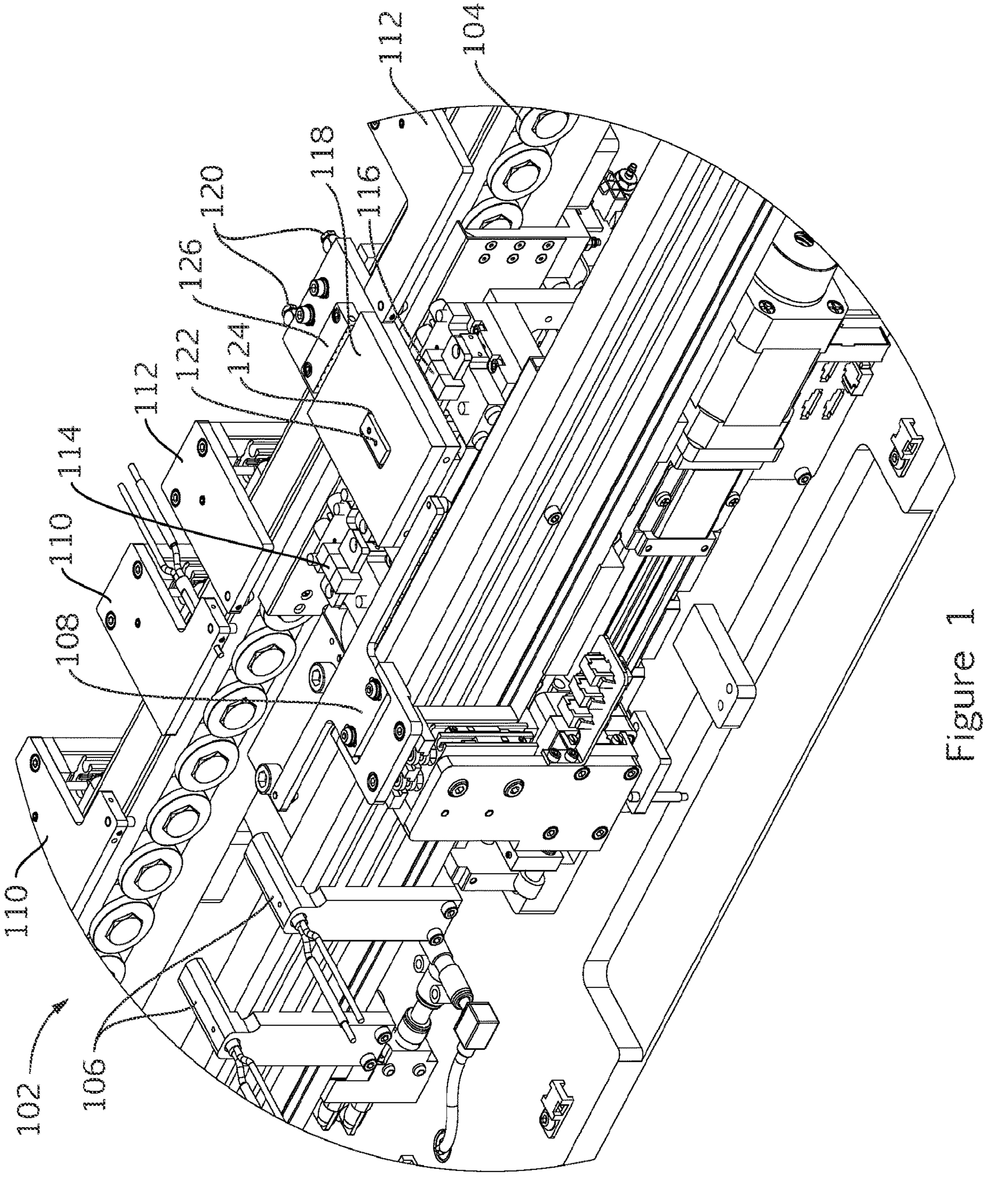
FIG. 1 is an illustration showing a thermocompression bonding system including an inert gas chamber configured to utilize standard common carriers/pallets, in accordance with embodiments of the present disclosure.

Now referring to FIG. 1, a portion of a typical thermocompression bonding system 102 including an inert gas chamber 100, in accordance with embodiments of the present disclosure is shown. The thermocompression bonding system 102 can be seen to comprise a conveyance system configured to move and properly align standard common carriers/pallets, the system including a conveyor 104, boat sensors 106, a boat indexer 108, boat stops 110, and boat locating stakes 112. The embodiment shown also includes pre-heaters 114 and post heaters 116 to allow the ramp-up of heat prior to bonding and ramp-down of heat thereafter to be controlled, which is often helpful in reducing defects that can be induced by rapid thermal changes (e.g. cracking).

Figure 6A:
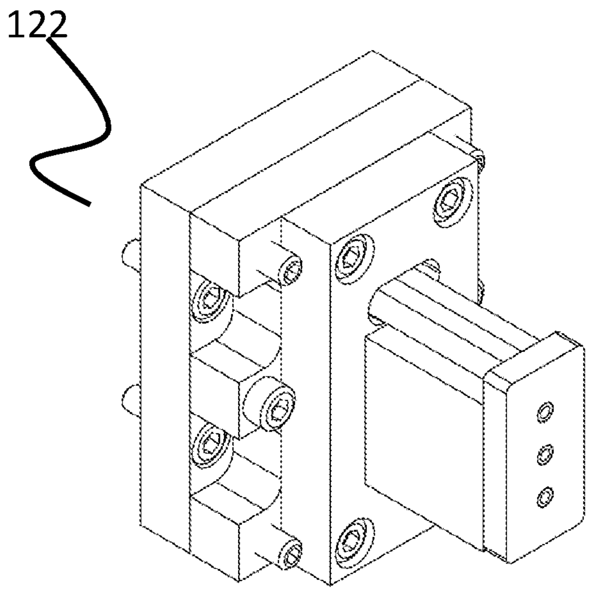
FIG. 6A is an illustration of the heater assembly showing a top side thereof, in accordance with embodiments of the present disclosure.
Figure 6B:
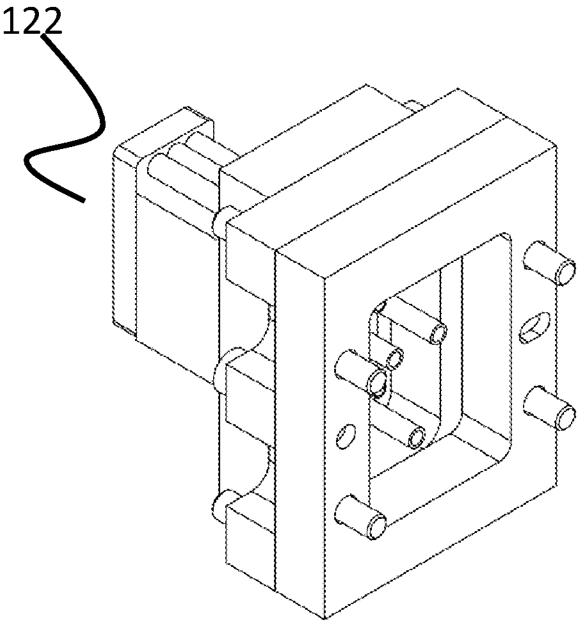
FIG. 6B is an illustration of the heater assembly showing a bottom side thereof, in accordance with embodiments of the present disclosure.

The inert gas chamber 100 is, in embodiments, located substantially centrally on the thermocompression bonding system 102, above the conveyance system, and comprises a cover 118 rotatable between at least a closed position and an open position, an aperture 204 configured to allow a bond heater 122 to push parts into the inert gas chamber 100 from below, and an aperture 124 configured to allow a bond tool, such as a die bonding head or the heater assembly 122 shown in FIGS. 3, 6A, and 6B, to pick and place dies into and bond dies inside of the inert gas chamber 100.

The inert gas chamber 100, in embodiments, receives inert gas through two ports 120 disposed in an edge thereof, the inert gas being introduced into the inert gas chamber 100 via a plurality of apertures 500 drilled into a base 202 of the inert gas chamber 100, substantially perpendicularly to the inert gas ports 120, such that they intersect therewith, allowing inert gas to be introduced inside of the inert gas chamber 100, between the base 202 and cover 118, thereby creating an inert environment suitable for bonding.

Figure 2:
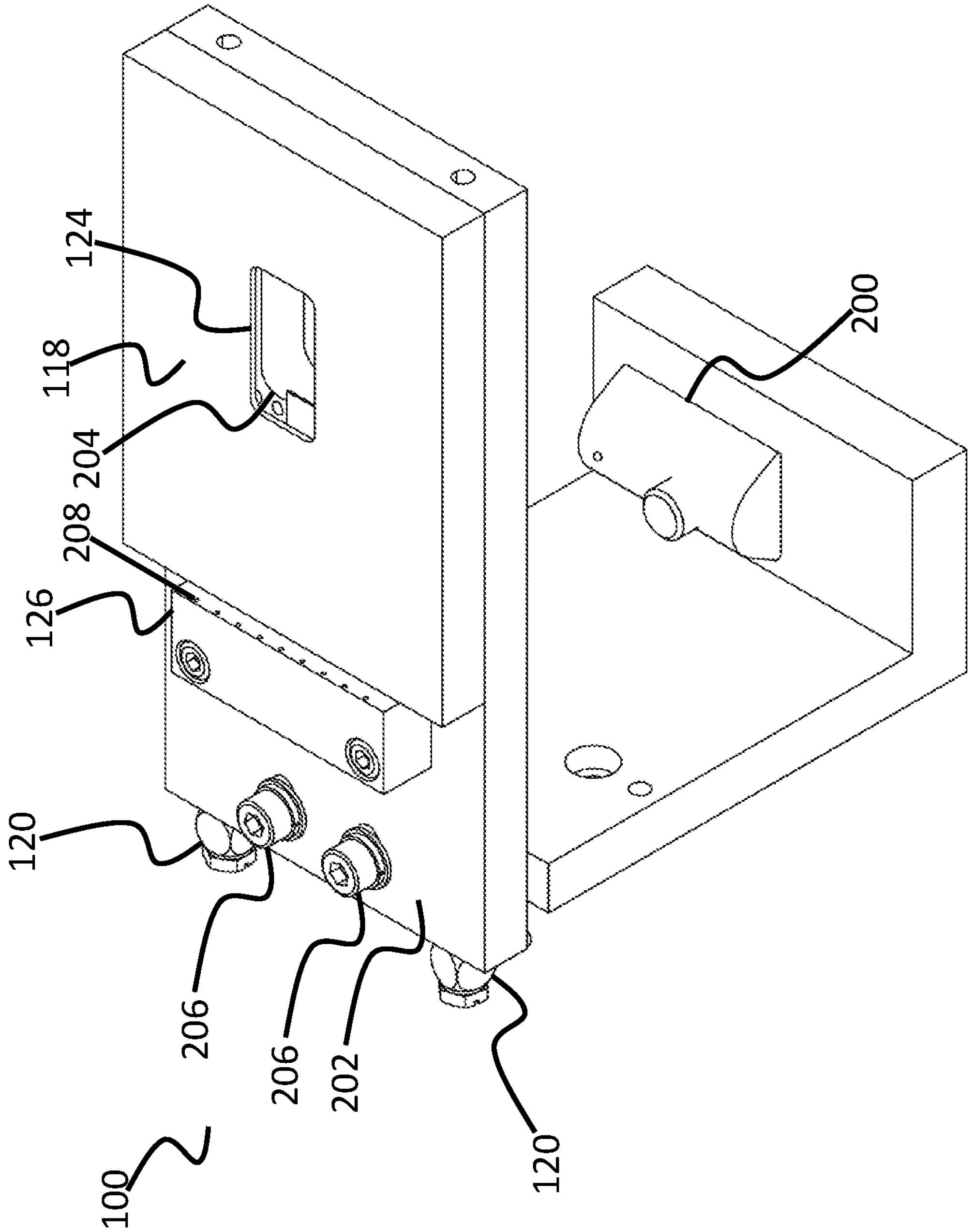
FIG. 2 is an illustration of an inert gas chamber configured to be mounted on a conveyor, as shown in FIG. 1, in accordance with embodiments of the present disclosure.
Figure 3:
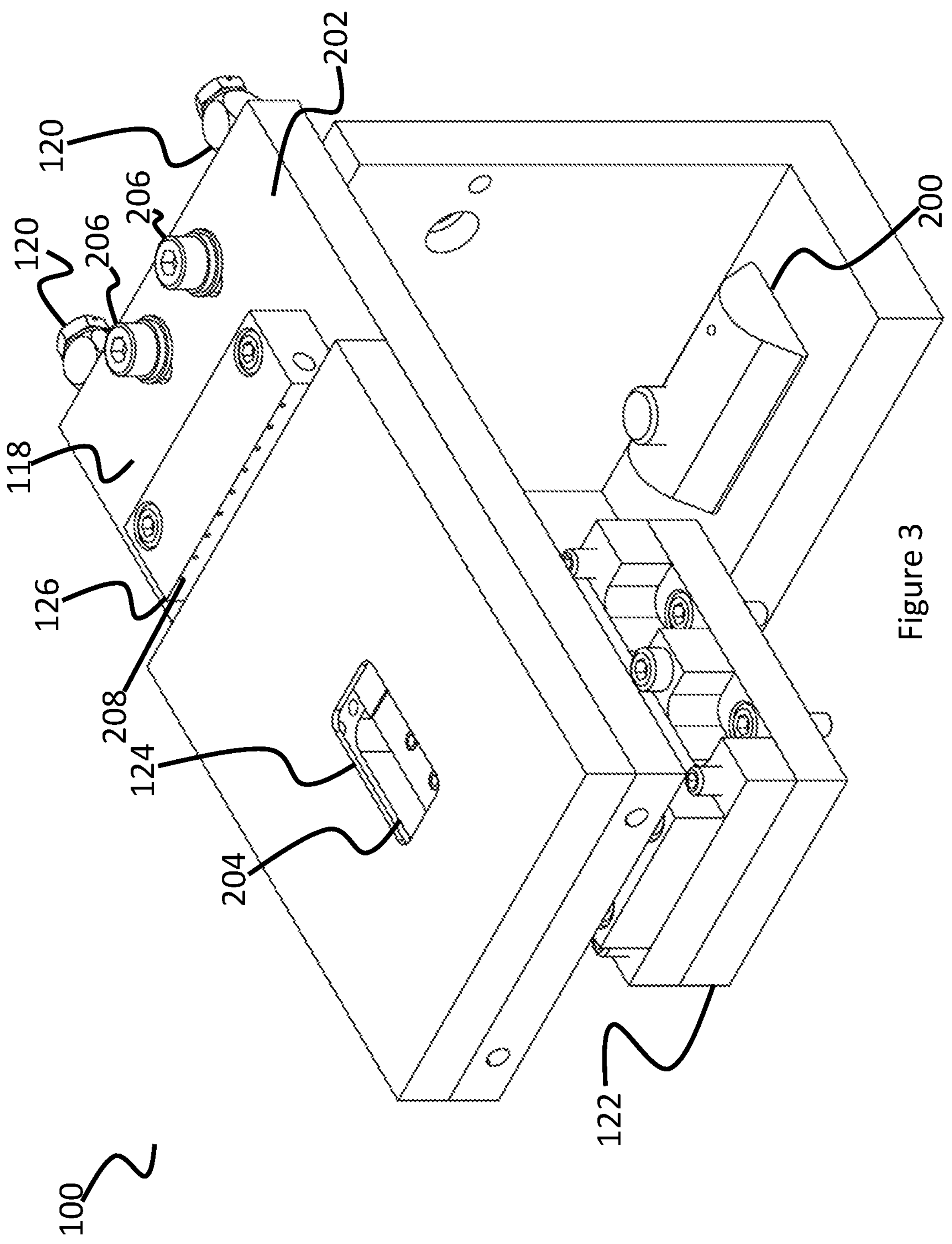
FIG. 3 is an illustration of an inert gas chamber including a heater assembly configured to push parts up from below into the inert gas chamber for bonding, in accordance with embodiments of the present disclosure.

FIGS. 2-5 as well as 6A and 6B show the inert gas chamber 100 divorced from the thermocompression bonding system 102, allowing details thereof to be more easily observed. FIG. 3, specifically, also includes the thermocompression bonding system's 102 heater assembly 122, which, in embodiments, is configured to push assemblies to be bonded out of a boat and through a bottom portion of the inert gas chamber 100, the assemblies to be bonded up from below into the inert gas chamber 100, where they can be bonded without oxidation.

More specifically regarding the embodiment of the inert gas chamber 100 shown in FIGS. 2 and 3, this embodiment includes an L-shaped bracket and T-nut 200 and is configured to mount to a conveyor 104, such as that shown in FIG. 1.

Figure 4:
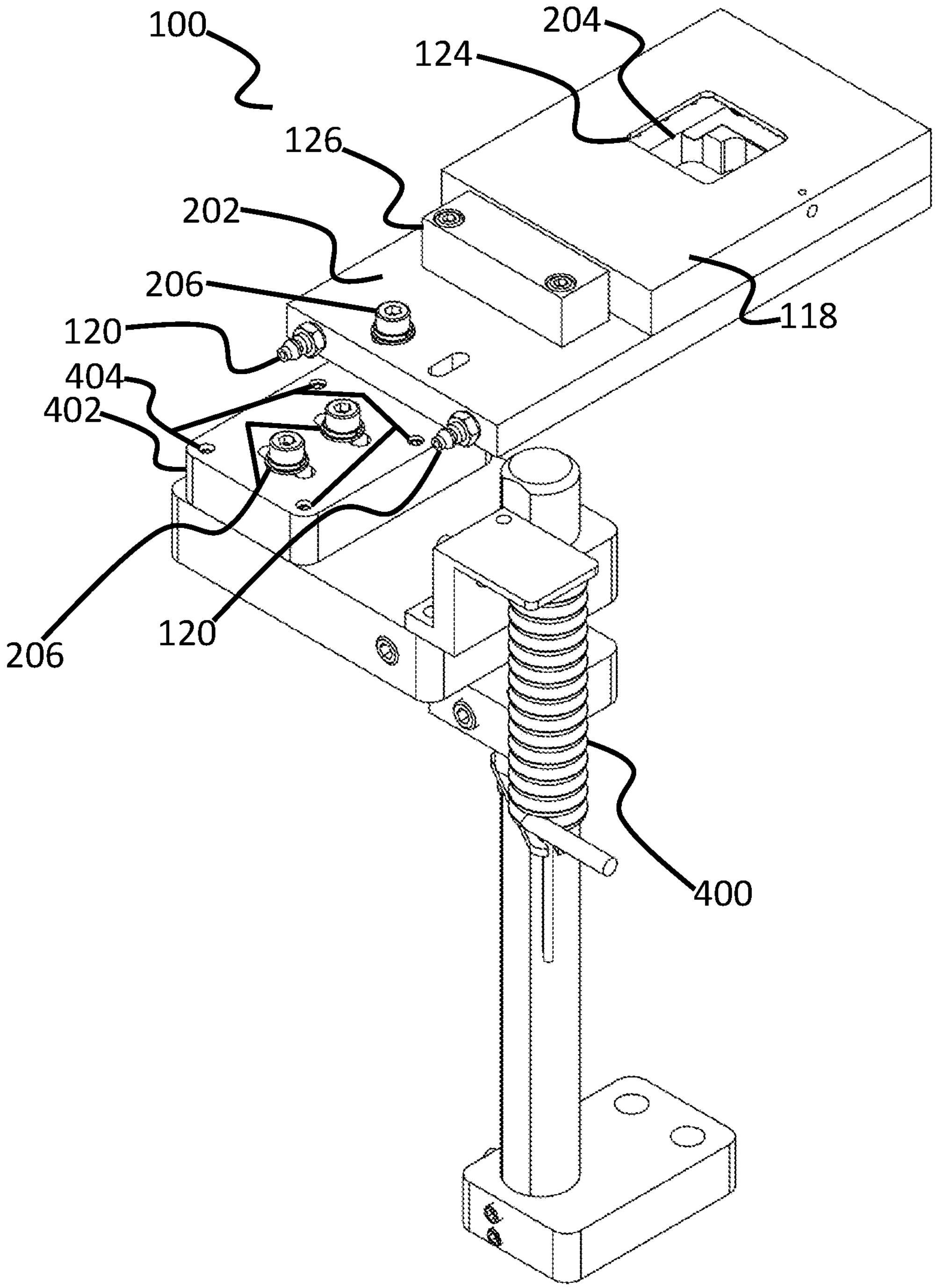
FIG. 4 is an illustration of an inert gas chamber and pedestal mount also showing a gas heater and levelling mount, in accordance with embodiments of the present disclosure.
Figure 5:
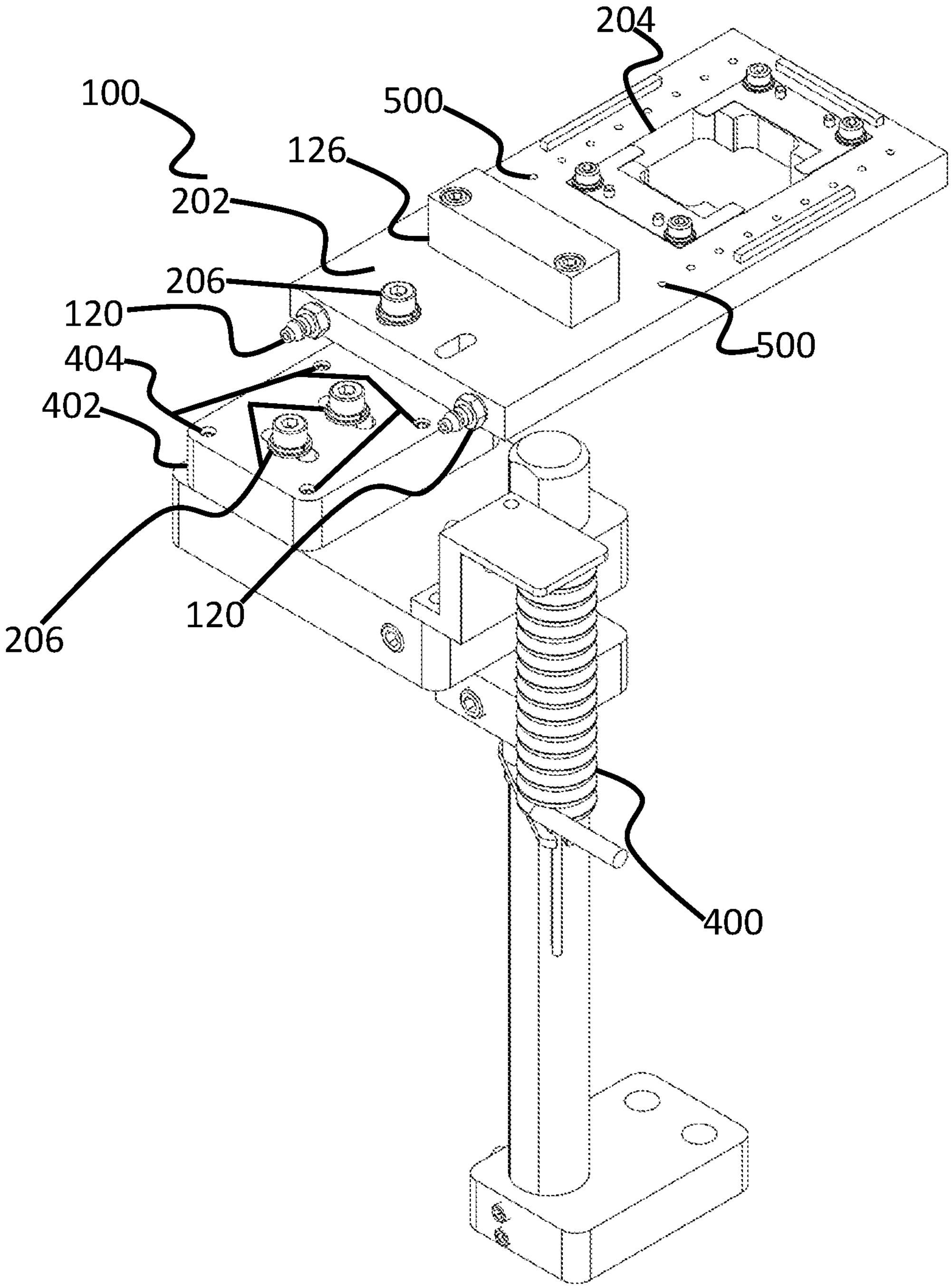
FIG. 5 is an illustration of an inert gas chamber of FIG. 4 with the cover removed, showing the inside of the inert gas chamber, in accordance with embodiments of the present disclosure.

More specifically regarding the embodiment of the inert gas chamber 100 shown in FIGS. 4 and 5, this embodiment includes pedestal-style mounting bracket and is configured to mount to a fixed portion of a thermocompression bonding system 102, such as that shown in FIG. 1. Also shown in FIGS. 4 and 5 is a gas heater 400 and levelling block 402 comprising levelling screws 404 and set screws 206.

Specifically regarding the aforementioned gas heater 400, in some instances, gases that do not flow well or otherwise do not readily displace oxygen from the inert gas chamber 100 may be used, whether out of necessity, because the use of a more appropriate gas is not economically feasible, or for some other reason. In these instances, a gas heater 400 can be used to heat the gas, rendering it more suitable for use in displacing oxygen from the inert gas chamber 100 and otherwise creating an inert environment for bonding. In embodiments, such as those making use of Nitrogen, the gas heater is configured to heat the gas to approximately 80 C.

Specifically regarding the aforementioned levelling block 402 comprising levelling screws 404 and set screws 206, such a system is included in embodiments to help create even forces from the clamping flexures used to hold dies to be bonded in the inert gas chamber 100.

In embodiments, the gas used to evacuate the inert gas chamber is forming gas. In embodiments, the forming gas is 5% hydrogen and 95% nitrogen. In other embodiments, pure nitrogen is used as a shielding gas.

In embodiments, the inert gas chamber 100 further comprises an air knife 126. In embodiments, the air knife 126 bolts or is otherwise affixed or formed into a top portion of the inert gas chamber 100 and comprises a plurality of apertures 208 in communication with a pressurized gas source, the plurality of apertures 208 being aimed along a top surface of the inert gas chamber's cover 118. In embodiments utilizing vision systems to align dies to be bonded, heat emanating from the inert gas chamber 100 can cause issues with vision. Through use of the air knife 126, such heat may be diffused, either as necessary or continuously, mitigating such issues.

In embodiments, the pressurized gas in communication with the pressurized air source is atmospheric air that is timed to limit the introduction of oxygen into the inert gas chamber 100 while displacing the heat emanating from the inert gas chamber 100 during or prior to the use of a machine vision system to provide improved vision.

In embodiments, the pressurized gas in communication with the pressurized air source is forming gas.

In embodiments, the bond heater 122 and inert gas chamber 100 are sized to accommodate standard common carriers (i.e. boats).

In embodiments, the inert gas chamber 100 includes an oxygen sensor configured to measure the concentration of oxygen in the inert gas chamber 100. In embodiments, the thermocompression bonding system 102 is configured to delay a bonding operation until the inert gas chamber 100 is evacuated of oxygen to a predetermined level. In embodiments, the oxygen sensor is remote from the inert gas chamber 100 and connected thereto via a port configured to convey a sample of gas from the inert gas chamber 100 to the oxygen sensor. In embodiments, the oxygen sensor monitors the oxygen concentration of the inert gas chamber 100 continuously. In embodiments, an output of the oxygen sensor is used as an input to a process control and monitoring system.

In embodiments, the inert gas chamber cover 118 is capable of being automatically actuated and moved between an open and closed state.

In embodiments, the inert gas chamber 100 includes a second cover configured to cover the aperture configured to allow a bond heater to push parts into the inert gas chamber 100 from below. In embodiments, the inert gas chamber's second cover is capable of being automatically actuated and moved between an open and closed state.

In embodiments, a bottom portion of the cover 118, i.e. the portion thereof that is in contact with the inert environment created within the inert gas chamber 100, comprises a roughened surface, which has been found to promote and help retain the inert environment within the inert gas chamber 100 by retaining the inert gas used to displace the oxygen therein. In embodiments, the roughened surface comprises microslots, which are, in embodiments, milled into the cover 118.

The foregoing description of the embodiments of the present disclosure has been presented for the purposes of illustration and description. It is not intended to be exhaustive or to limit the present disclosure to the precise form disclosed. Many modifications and variations are possible in light of this disclosure. It is intended that the scope of the present disclosure be limited not by this detailed description, but rather by the claims appended hereto.

A number of implementations have been described. Nevertheless, it will be understood that various modifications may be made without departing from the scope of the disclosure. Although operations are depicted in the drawings in a particular order, this should not be understood as requiring that such operations be performed in the particular order shown or in sequential order, or that all illustrated operations be performed, to achieve desirable results.

What is claimed is:

1. A system for the placement of dies on a substrate, the system comprising:

an inert gas chamber comprising a top cover configured to cover at least a portion of the top of the inert gas chamber during a die attach operation, at least one gas input located outside of the inert gas chamber, and a plurality of apertures disposed within the inert gas chamber in a base thereof, the plurality of apertures being in communication with the at least one gas input, wherein the inert gas chamber is configured to accept a heater assembly through a bottommost portion thereof, wherein the inert gas chamber is configured to accept a die bonding head through a cover portion thereof, and wherein said inert gas chamber is configured for mounting to a thermocompression bonding system via a levelling block comprising levelling screws and set screws, wherein the levelling screws are configured to thread in to said levelling block and press against a surface the levelling block is secured to via the set screws, thereby allowing the inert gas chamber to be levelled.

2. The system of claim 1 further comprising a gas heater configured to heat a gas passing through the at least one gas input outside of the inert gas chamber.

3. The system of claim 1 further comprising a gas heater configured to heat a gas passing through the at least one gas input located outside of the inert gas chamber.

4. The system for the placement of dies on a substrate of claim 1 wherein the heater assembly is configured to seal the bottommost portion of the inert gas chamber when the heater assembly is located in a bottommost portion thereof.

5. The system of claim 1 further comprising an oxygen sensor in operative communication with the inert gas chamber, the oxygen sensor configured to output an oxygen concentration within the inert gas chamber to a process and control system configured to prevent a die attach operation prior to the oxygen concentration within the inert gas chamber dropping below a predetermined level.

6. The system of claim 1 wherein the top cover is movable between an open position and a closed position.

7. The system of claim 6 wherein the top cover is configured for remote actuation between the open and closed positions.

8. The system of claim 6 further comprising a bottom cover configured to cover at least a portion of the bottom of the inert gas chamber.

9. An inert gas chamber, the inert gas chamber comprising:

a top cover configured to cover at least a portion of a top of the inert gas chamber;

at least one gas input located outside of the inert gas chamber; and a plurality of apertures disposed within the inert gas chamber in a base thereof, the plurality of apertures being in communication with the at least one gas input, wherein the inert gas chamber is configured to accept a heater assembly through a bottommost portion thereof, wherein the inert gas chamber is configured to accept a die bonding head through a cover portion thereof, and wherein said inert gas chamber is configured for mounting to a thermocompression bonding system via a levelling block comprising levelling screws and set screws, wherein the levelling screws are configured to thread in to said levelling block and press against a surface the levelling block is secured to via the set screws, thereby allowing the inert gas chamber to be levelled.

10. The inert gas chamber of claim 9 wherein the inert gas chamber is configured to utilize a conveyance system configured to accommodate a plurality of parts to be bonded.

11. The inert gas chamber of claim 9 further comprising a gas heater configured to heat a gas passing through the at least one gas input outside of the inert gas chamber.

12. The inert gas chamber of claim 9 further comprising an oxygen sensor in operative communication with the inert gas chamber, the oxygen sensor configured to output the oxygen concentration within the inert gas chamber to a process and control system.

13. The inert gas chamber of claim 12 wherein the top cover is movable between an open position and a closed position.

14. The inert gas chamber of claim 13 wherein the top cover is configured for remote actuation between the open and closed positions.

15. The inert gas chamber of claim 13 further comprising a bottom cover configured to cover at least a portion of the bottom of the inert gas chamber.

16. The inert gas chamber of claim 15 wherein the bottom cover is movable between an open position and a closed position and wherein the bottom cover is configured for remote actuation between the open and closed positions.

17. A method of die bonding using an inert gas chamber, the method comprising:

providing an inert gas chamber, the inert gas chamber comprising:

a top cover configured to cover at least a portion of the top of the inert gas chamber, at least one gas input located outside of the inert gas chamber, and a plurality of apertures disposed within the inert gas chamber in a base thereof, the plurality of apertures being in communication with the at least one gas input, wherein the inert gas chamber is configured to accept a heater assembly through a bottommost portion thereof, wherein the inert gas chamber is configured to accept a die bonding head through a cover portion thereof, and wherein said inert gas chamber is configured for mounting to a thermocompression bonding system via a levelling block comprising levelling screws and set screws, wherein the levelling screws are configured to thread in to said levelling block and press against a surface the levelling block is secured to via the set screws, thereby allowing the inert gas chamber to be levelled, attaching the inert gas chamber to a thermocompression bonding system;

levelling the inert gas chamber to the thermocompression bonding system using the levelling screws;

introducing at least one part to be bonded to the inert gas chamber;

closing the top cover of the inert gas chamber;

inserting the heater assembly through a bottommost portion of the inert gas chamber;

flooding the inert gas chamber with a substantially inert gas through the at least one gas input;

bonding the at least one part to be bonded;

opening the top cover of the inert gas chamber; and removing the at least one part from the inert gas chamber.

* * * * *